United States Patent [19]  
Le Roux et al.

[11] Patent Number: 4,724,343  
[45] Date of Patent: Feb. 9, 1988

[54] CONVERSION CIRCUIT OF A DIFFERENTIAL INPUT IN CMOS LOGIC LEVELS

[75] Inventors: Gérard Le Roux, La Tranche; Francoise Vialettes, St. Egreve, both of France

[73] Assignee: Thomson-CSF, Paris, France

[21] Appl. No.: 908,671

[22] Filed: Sep. 17, 1986

[30] Foreign Application Priority Data

Sep. 17, 1985 [FR] France ............................... 85 13758

[51] Int. Cl.$^4$ ..................... H03K 19/092; H03K 3/26; H03K 17/60; H03K 19/02
[52] U.S. Cl. .................................. 307/475; 307/279; 307/446; 307/570
[58] Field of Search ............... 307/475, 451, 446, 443, 307/570, 279, 494

[56] References Cited

U.S. PATENT DOCUMENTS 4,438,351  3/1987  Schuermeyer ..................... 307/279

FOREIGN PATENT DOCUMENTS 0154370  9/1985  European Pat. Off. ............ 307/475
0070626  4/1983  Japan ................................... 307/494

Primary Examiner—Stanley D. Miller  
Assistant Examiner—Trong Q. Phan  
Attorney, Agent, or Firm—Oblon, Fisher, Spivak, McClelland & Maier

[57] ABSTRACT

The present invention relates to a conversion circuit having a differential input in CMOS logic levels, this circuit comprising an input comparator comprising two NPN type bipolar transistors, connected by their emitters and receiving differential input signals on their bases; a CMOS flip-flop comprising two branches each constituted by a P-channel MOS transistor in series, with two N-channel MOS transistors of each branch being connected in order to set the current of these branches at the passing state, the gates of the first N-channel MOS transistors of each branch being connected to the drains of the P-channel transistors of the other branch and to an output terminal. This circuit can be used in plasma panel command operations.

2 Claims, 4 Drawing Figures

FIG_1
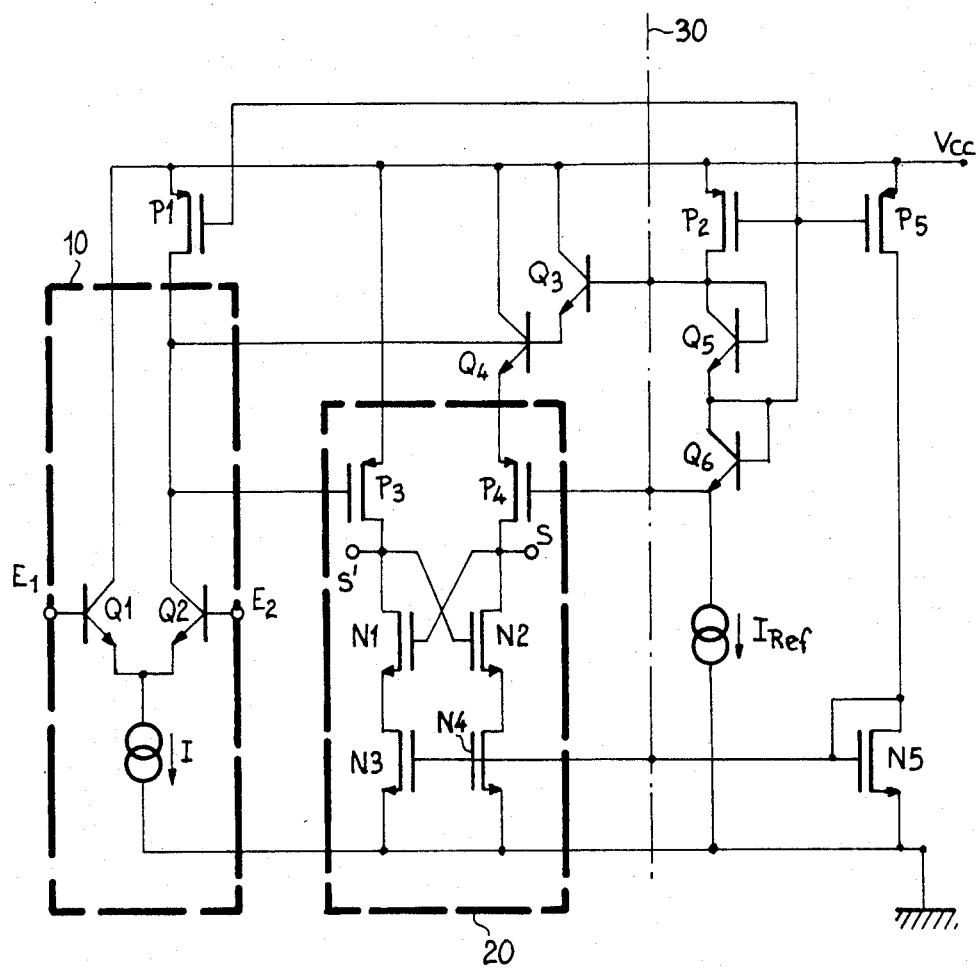

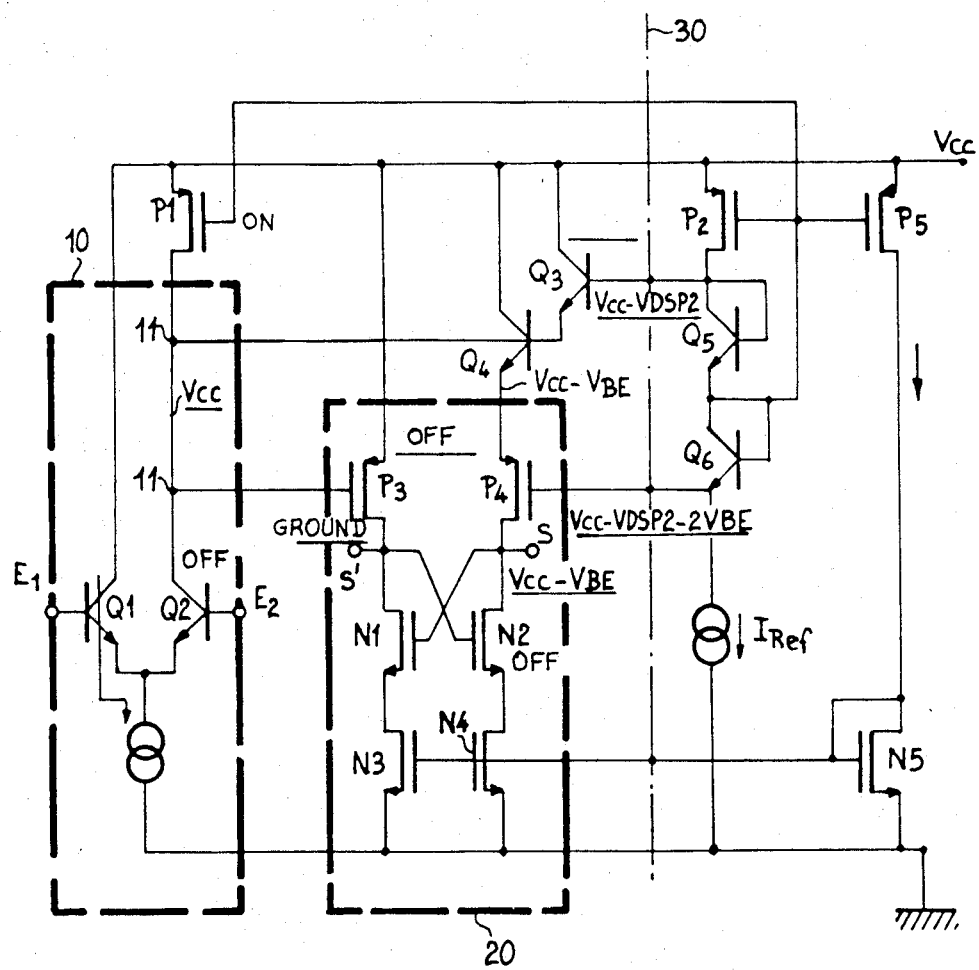
FIG_2

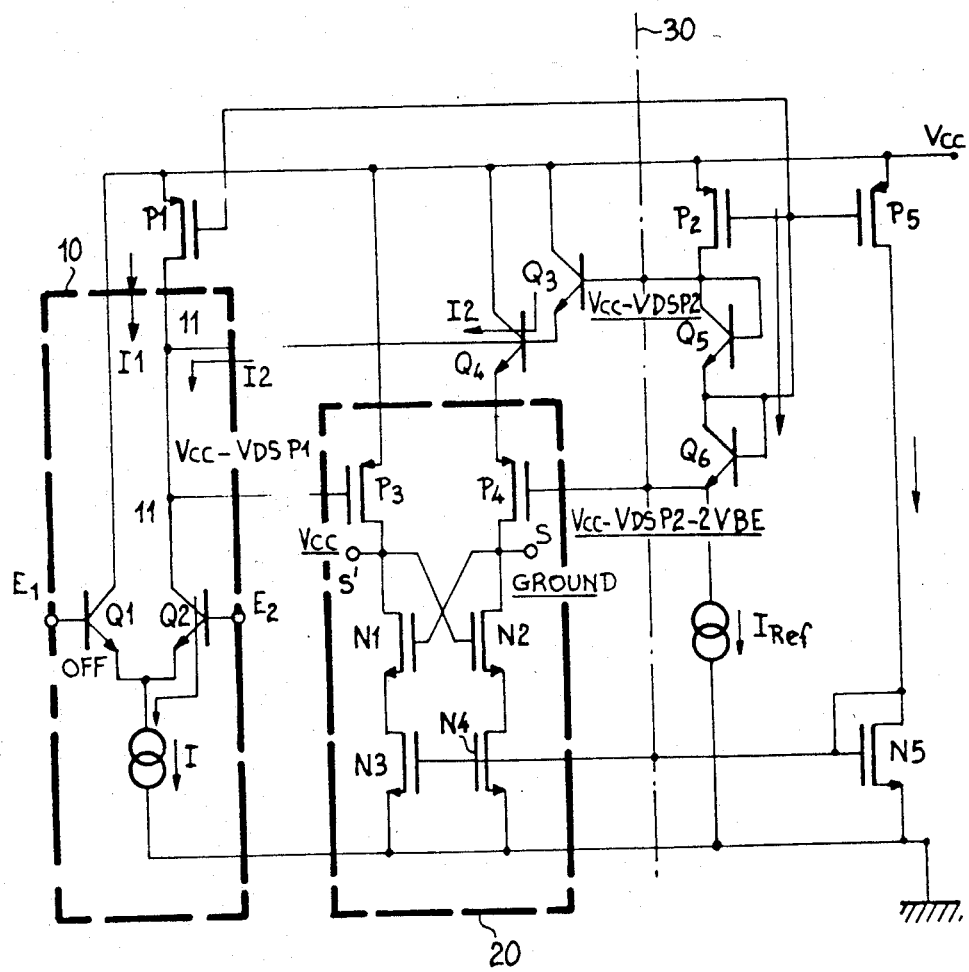
FIG_3

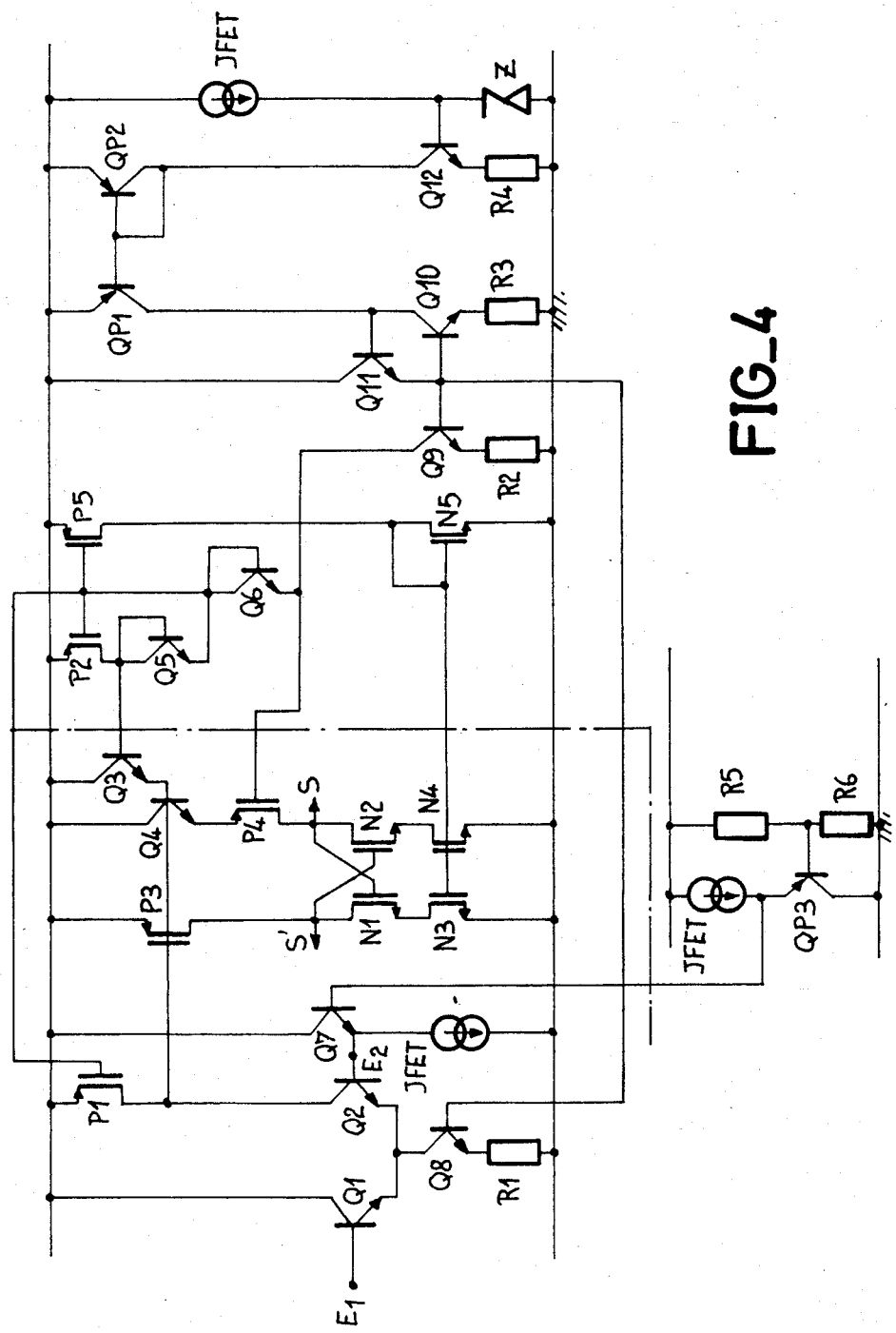
FIG_4

CONVERSION CIRCUIT OF A DIFFERENTIAL INPUT IN CMOS LOGIC LEVELS

BACKGROUND OF THE INVENTION

1. Field of the Invention

The present invention relates to the field of logic circuits and more particularly a conversion circuit adapted to convert input signals corresponding to a first logic family into logic signals compatible with CMOS-type logic flip-flops.

2. Discussion of Background

For example, if it is desired to actuate CMOS logic flip-flops by logic signals issuing directly from a TTL type logic, given the variation range of the logic levels of a TTL logic, it is possible that the high and low logic levels be insufficiently differentiated to allow a reliable actuation of a CMOS logic. By way of numerical example, a CMOS logic circuit requires a threshold voltage of about 1.5 V while the TTL logic circuit has a voltage threshold of 1.4 V, which however can vary between 0.8 and 2 V in function of various parameters such as the fluctuations of power voltage, temperature variations, etc.

One particular object of the present invention is to produce such a conversion circuit which can operate at high speed, for example, at a frequency of about 10 MHz for a high level of 12 V, such a circuit being able, for example, to be used in actuating plasma panels. Another requirement for actuating plasma panels is to produce a circuit presenting a good immunity to interference or disturbing noise since, on the same integrated circuit chip as that comprising the CMOS logic, are located switching devices for the plasma panel switching voltages that can vary from 0 to more than 100 V, for example.

Among the circuits of the prior art intended to ensure a conversion between the logic signals of a first family and the logic signals for the CMOS flip-flop can be cited:

- circuits in which the input occurs on the base of a PNP transistor; such circuits cannot be used to achieve the objects of the present invention due to the speed deficiency inherent in PNP transistors on silicon of which the maximal frequency is limited to values of about 1 to 4 MHz;
- circuits in which are placed at the input a CMOS inverter whose dimensions are disproportional; neither does this allow to achieve the speeds desired since the fact of using large-size MOS transistors means that said transistors have high disturbing capacities and thus that their operating speed is reduced;
- circuits that are wholly CMOS without bipolar transistors, do not allow, in a inherent manner, to overcome the difficulties associated to the creation of a sufficiently low voltage level for the CMOS flip-flop as lower threshold voltage.

SUMMARY OF THE INVENTION

Therefore, in order to obtain the objects set out hereinabove and to overcome the drawbacks of the devices according to the prior art, the present invention provides a conversion circuit of a differential input in CMOS logic levels comprising:

- an input comparator comprising two NPN-type bipolar transistors connected by their emitters and receiving differential input signals on their bases;
- a CMOS flip-flop comprising two branches each of which is constituted by a P channel MOS transistor in series with two N channel MOS transistors, the gate of the second N channel MOS transistors of each branch being connected in order to set the current of these branches at the passing state while the gate of the first N channel MOS transistors of each branch are connected to the drains of the P channel transistors of the other branch and to an output terminal.

In this circuit:

- the second branch of the comparator is connected to a $V_{CC}$ power voltage by a load constituted by a P channel MOS transistor, and to the gate of the P channel MOS transistor of the first branch of the flip-flop;
- the second branch of the CMOS flip-flop is connected to the $V_{CC}$ power voltage by a NPN bipolar transistor of which the base is connected to means for supplying a first potential taking one or other of the two values according to the state of the input and is also connected to the second branch of the comparator; and
- the gate of the P channel transistor of the second branch of the flip-flop is connected to means for supplying a second determined potential associated to the values of the first in order to ensure the conducting or the blocking of this transistor and thus of the state of the CMOS flip-flop.

In one embodiment of the conversion circuit:

- the means for supplying the first and second determined potentials comprise: a first series circuit constituted by a P channel MOS transistor, two NPN type bipolar transistors mounted in diodes and a current supply;
- the grids of the P channel MOS transistors of the first and second circuits in series are interconnected and are connected to the gate of the P channel transistor of the second branch of the comparator, these gates being connected to the drain of the P channel MOS transistor of the first circuit series or to a voltage point higher than that of this drain;
- the drain of the P channel transistor of the first series circuit is connected to the base of a PNP type bipolar transistors which is connected by its emitter to the base of the bipolar transistor of the second branch of the flip-flop and by its collector to the power voltage;
- a point of the first series circuit, having a voltage lower than 2 $V_{BE}$ (base to emitter) at the drain voltage of the P channel MOS transistor of this circuit, is connected to the gate of the P channel transistor of the second branch of the flip-flop.

In one embodiment of the conversion circuit, the first and second circuit series can be common to a large number of such conversion circuits for an assembly of CMOS logic flip-flops.

BRIEF DESCRIPTION OF THE DRAWINGS

These objects, features and advantages as well as others of the present invention will be explained in further detail in the following description of particular embodiments given with reference to the appended drawings in which:

FIG. 1 represents a wiring diagram of a circuit according to the present invention;

FIGS. 2 and 3 repeat the schema represented in FIG. 1, while indicating the voltage values and the current travel directions for each of the input signal states; and FIG. 4 indicates a detailed embodiment of the present invention.

DESCRIPTION OF THE INVENTION

FIG. 1 represents the circuit according to the present invention, in which power is supplied between a $V_{CC}$ (collector supply voltage) input terminal and the earth.

This circuit comprises an input comparator 10, a CMOS flip-flop 20 and circuits to suitably supply, command and control this comparator and this flip-flop.

The input comparator 10 comprises NPN type bipolar transistors. As was noted herein-above, this choice of NPN type transistors is not accidental but is necessary in order to reach the operating rapidities that are required. More particular, the comparator comprises a first NPN transistor Q1 and a second NPN transsitor Q2 of which the emitters are interconnected and are also connected to a current supply I. The base of the transistor Q1 is connected to an input terminal EI that receives the logic signal to be converted; the base of the transistor Q2 is connected to an input terminal E2 which receives a reference signal chosen so as to be clearly intermediary between the possible high and low values of the logic level at the input terminal E1. The collector of the transistor Q1 is connected to the $V_{CC}$ power voltage. The collector of the transistor Q2 is connected to this $V_{CC}$ power voltage through a charge constituted by a P channel MOS transistor, P1.

The CMOS flip-flop 20 comprises two branches. The first branch comprises in series a P-channel MOS transistor P3, a N-channel MOS transistor N1 and a N-channel MOS transistor N3. The second branch comprises a P-channel transistor P4, a N-channel MOS transistor N2 and a N-channel MOS transistor N4. As will be seen herein-below, the transistors N2 and N4 are essentially current sources intended to ensure the current circulation in the flip-flop during the switching phases. In fact, it is necessary that this current circulation be high enough for the commutation to be rapid. The gate of the transistor N1 of the first branch is connected to the drain of the transistor P4 of the second branch and further more the gate of the transistor N2 is connected to the drain of the transistor P3. These connections also constitute the direct (S) and complementary outputs S' of the flip-flop.

The sources of the second transistors N3 and N6 are connected to ground. The source of the transistor P3 is connected to the $V_{CC}$ power voltage and the source of the transistor P4 is connected to $V_{CC}$ through a transistor Q4. The gate of the transistor P3 receives the output of the comparator 10 on the collector terminal of the transistor Q2.

Furthermore, the base of the transistor Q4 is connected to the $V_{CC}$ power voltage through the intermediary of a transistor Q3. This connecting point is also connected to the collector of the transistor Q2.

The power, actuating and controlling circuits comprise a first series circuit comprising in series a P-channel MOS transistor P2, two NPN type bipolar transistors Q5 and Q6, mounted in diodes, and a current supply $I_{REF}$, this first series circuit being connected between the input terminal $V_{CC}$ and the earth. A second series circuit connected between the $V_{CC}$ power voltage and the earth comprises a P-channel MOS transistor P5 and a N-channel MOS transistor N5 of which the drain and the gate are connected. The gates of the transistors P2 and P5 are interconnected and this connecting point is connected to the gate of the transistor P1 and to the connecting point of the two diodes Q5 and Q6. The drain of the transistor P2 is connected to the base of the transistor Q3. The connecting point between the second diode Q6 and the $I_{REF}$ current supply is connected to the gate of the transistor P4. The gate of the transistor N5 is connected to the gates of the transistors N3 and N4.

OPERATING OF THE CIRCUIT IN THE CASE WHERE THE INPUT SIGNAL IS AT THE HIGH LEVEL

FIG. 2 represents in further detail the operating of the circuit in the case where the input signal on the terminal E1 is at the high level, i.e. where the voltage at the terminal E1 is higher than the voltage at the terminal E2. In this case, the transistor Q1 is conductive (passing) and the transistor Q2 is blocked. The transistor P1 being normally in the passing state the potential at the collector terminal 11 of the transistor Q2 increases up to the value of the power supply $V_{CC}$. Consequently, the transistor P3, of which the gate is at the same potential as the supply, is blocked and the transistor P4 is brought to the passing state since its supply is at the $V_{CC}-V_{BE}$ potential (base emitter voltage drop in the transistor Q4) and its gate is at the $V_{CC}-V_{DSP2}-2V_{BE}$ potential imposed by the current circulation in the first series circuit P2; Q5, Q6 ($V_{DS}$=drain-source voltage). The transistor Q3 of which the emitter and the collector are at the same potential and of which the baes is at a lower potential is blocked.

The transistor P4 being at the passing state, its drain arrives at substantially the same potential as the supply, i.e. $V_{CC}-V_{BE}$. It is the voltage on the direct output terminal S of the CMOS flip-flop. The circulation of the current in the transistor P1, the base-emitter junction of the transistor Q4 and the transistor P4 renders the transistor N1 passing. The current supply constituted by the transistor N3 thus draws the output S' towards ground (since the transistor P3 is blocked), thereby having the effect of blocking the transistor N2 and of strengthening the high state at the output S. To conclude, the equilibrium state achieved when the input E1 is at the high level, is a state where:

$$S = V_{CC} - V_{BE} \quad S' = 0$$

During this equilibrium state, the current in the two branches of the CMOS flip-flop becomes zero.

OPERATING OF THE CIRCUIT IN THE CASE WHERE THE INPUT SIGNAL IS AT LOW LEVEL

In this case, illustrated in FIG. 3, in the input comparator, the transistor Q1 is blocked while the transistor Q2 is passing. Thus, a current circulates in the transistor P1 and the transistor Q2. Due to this conduction in the transistor P1, the voltage at the terminal 11 is equal to $V_{CC}-$ the drain-source voltage drop on the transistor P1 ($V_{DSP1}$). The potential on the emitter of the transistor Q3 becomes lower than the potential on its collector while its base potential is still $V_{CC}-V_{DSP2}$. This transistor is thus rendered conductor and a current also circulates towards the transistor Q2 by passing through the transistor Q3. Thus, the current I imposed in the transistor Q2 is the total of the current I1 in the transistor Q1 and of the current I2 in the transistor Q3. The transistor P3 of the flip-flop 20 of which the gate potential becomes lower than the drain potential becomes conductor thus causing the potential on the output terminal S' of the flip-flop to pass at the value $V_{CC}$. Thereafter, the transistor N2 becomes passing and the transistor N4 acting as a current supply causes the terminal S to be downwardly displaced towards 0, thereby lowering the supply potential of the transistor P4 towards the potential of the terminal 11 (i.e. $V_{CC}-V_{DSP1}$) reduced by the base-emitter voltage drop of the transistor Q4, $V_{BEQ4}$, since the whole chain formed of Q4, P4, N2, N4 is thus momentarily conductive. This conduction is interrupted once the gate-source voltage of the transistor P4 becomes lower than the threshold voltage of this transistor. The point S is thus brought to 0 by the transistors N2, N4. Simultaneously, this drop in potential at the terminal S blocks the transistor N1 which confirms the raise of the terminal S' to $V_{CC}$.

When the potential on the input E1 is lower than the potential on the input E2, the equilibrium state achieved is thus S=0 and S'=$V_{CC}$, the current in the two branches of the flip-flop (P3, N1, N3 and Q4, P4, N2, N4) being zero.

Therefore, the circuit according to the present invention presents a slight disymmetry at the output since, in a first state, the output S is at $V_{CC}-V_{BE}$ S' at 0 whereas, in a second state, the voltage S' is at $V_{CC}$ and the voltage S at 0. Nevertheless, in practice, this does not present a drawback for the CMOS gate command, especially if it is noted that $V_{CC}$ is a command voltage of 12 V and $V_{BE}$ a voltage of about 0.7 V.

It is well understood that the present invention can be adapted to numerous variants, one of the essential aspects lying in the fact that, in the state where the CMOS flip-flop must have its output S and 0 at its high output S' at high level, the voltage on the gate of the MOS transistor P3 ($V_{CC}-V_{DSP1}$) differs from the voltage on the gate of the MOS transistor P4 ($V_{CC}-V_{DSP2}-2V_{BE}$) by a value equal to $V_{BE}$, while noting that $V_{DSP2}$ is equal to $V_{DSP1}-V_{BE}$ in the embodiment previously described. Thus, for example, the common gate terminal of transistors P1, P2, P5 can be connected between the diode Q5 and the drain of the transistor P2 instead of being connected between the two diodes Q5 and Q6. Furthermore, the circuit can be rendered more complex by adding supplementary transistors as long as the same differences of voltage at the critical points of the circuit are noted, i.e especially on the gates of transistors P3 and P4.

FIG. 4 represents a more detailed embodiment of the present invention in which are, especially indicated the current supply I in the bipolar comparator and the $I_{REF}$ current supply in the first series circuit (P2, Q5, Q6, $I_{REF}$) as well as the circuit to supply a reference voltage on the terminal E2 of the input comparator 10.

In the present description only the circuit elements of FIG. 4 that differ from those of FIG. 1 will be described.

Current supply I of FIG. 1 is obtained by connecting in series a NPN bipolar transistor Q8 and a resistance R1 between the emitters of bipolar transistors Q1, Q2 and the earth. The base of the transistor Q8 is connected to the bases of transistors Q9 and Q10 that will be described herein-below.

The $I_{REF}$ current supply in the series circuit P2, Q5, Q6, $I_{REF}$ is achieved by connecting in series a NPN bipolar transistor Q9 and a resistance R2 between the diode Q6 and the earth. The base of the transistor Q9 is connected to the base of a transistor Q10 of which the emitter is connected to the earth through the intermediary of a resistance R3 and the collector to a power voltage through the intermediary of a PNP transistor QP1. This transistor QP1 is mounted in current mirror with a PNP type transistor QP2 of which the base and the collector are connected, of which the emitter is connected to the terminal $V_{CC}$ and of which the collector is connected to the earth through the intermediary of the connection in series of a PNP type bipolar transistor Q12 and a resistance R4. The potential on the base of the transistor Q12 is set by a Zener diode Z supplied by a current supply produced by a JFET type transistor. The base of the transistors Q9 and Q10 is connected to the power terminal $V_{CC}$ by a NPN type bipolar transistor Q11 of which the base is connected to the collector of the transistor Q10. The bases of the transistors Q9 and Q10 are connected, as previously noted, to the base of the transistor Q8 acting so as to supply current to the input comparator.

The reference voltage supplied to the input E2 of the comparator 10 results from the connection of this input E2 to the terminal $V_{CC}$ through the intermediary of a NPN type bipolar transistor, this terminal also being connected to the earth through the intermediary of a current source produced by a JFET type transistor. The base of the transistor Q7 is connected to a voltage reference circuit which can be common to a large number of circuits. This voltage reference circuit, connected between $V_{CC}$ and the earth, comprises a PNP type transistor QP3 with a JFET current supply, the current supply being connected to the $V_{CC}$ terminal and the collector of the PNP transistor QP3 to the earth. The base biasing of the transistor QP3 is ensured by a resistance divider R5, R6.

We claim:

1. A conversion circuit for converting a differential input into CMOS logic levels, said conversion circuit comprising:

an input comparator having a first and a second branch wherein each of said branches comprises a NPN-type bipolar transistor with said bipolar transistors being connected to each other by their emitters and wherein each of said bipolar transistors receives one of differential input signals at the base of each of said bipolar transistors.

a CMOS flip-flop having a first and a second section wherein each of said frist and second section is constituted by P-channel MOS transistor connected in series with a first and a second N-channel MOS transistors, wherein the gates of said second N-channel MOS transistors of each of said first and second section are connected together in order to set the current of said sections at a passing state, and the gates of said first N-channel MOS transistors of said first and said second section are connected respectively to the drains of the P-channel transistors of said second and said first section and wherein said gates of said first N-channel MOS transistors are also connected to an output terminal, and wherein said second branch of said comparator is connected to a power voltage by a load wherein said load is constituted by P-channel MOS transistor and wherein said second branch of said comparator is also connected to the gate of the P-channel MOS transistor of said first section of said CMOS flip-flop; and wherein said second section of said CMOS flip-flop is connected to said power voltage by a NPN bipolar transistor wherein the base of said NPN bipolar transistor is connected to a means for supplying a first potential which provide one of a first and a second state according to the state of said differential input and wherein said base of said NPN bipolar transistor is also connected to said second branch of said comparator; and the gate of said P-channel transistor of said second section of said CMOS flip-flop is connected to a means for supplying a second predetermined potential associated with the value of said first potential in order to ensure the conducting or the blocking of said P-channel transistor of said second branch and thus of the state of said CMOS flip-flop.

2. The circuit according to claim 1, wherein:

said means for supplying said first and second potentials comprise;

a first series circuit constituted by power supply P-channel MOS transistor, two power supply NPN type bipolar transistors mounted in diodes, a current supply and a second series circuit in parallel with said first series circuit wherein said second series circuit comprises a second series P-channel MOS transistor and a second series N-channel MOS transistor;

wherein the gates of said P-channel MOS transistor of said first and second series circuits are interconnected and are also connected to the gate of said P-channel transistor of said second branch of said comparator wherein said gates of said P-channel transistors of said first and second series circuits and of said second branch of said comparator are connected to the drain of said P-channel transistor of said first series circuits or to a voltage point higher than the voltage of said drain of said P-channel transistor of said first series circuit;

wherein the drain of said P-channel transistor of said first series circuit is connected to the base of a separate PNP-type bipolar transistor which is connected by its emitter to the base of said NPN bipolar transistor connected to said second branch of said CMOS flip-flop and wherein said separate PNP-type bipolar transistor is connected by its collector to said power voltage;

wherein a point of said first series circuit, having a voltage lower than said drain voltage of said P-channel MOS transistor of said first series circuit wherein said voltage is lower than said drain voltage by a value of 2 $V_{BE}$ and wherein said point of said first series circuit having said lower voltage is connected to the gate of said P-channel transistor of said second branch of said CMOS flip-flop.

* * * * *